United States Patent [19]

Manning et al.

[11] Patent Number: 4,808,822
[45] Date of Patent: Feb. 28, 1989

[54] THERMAL DETECTOR

[75] Inventors: Paul A. Manning; Rex Watton, both of Malvern, England

[73] Assignee: The Secretary of State for Defence in Her Britannic Majesty's Government of the United Kingdom of Great Britain and Northern Ireland, London, England

[21] Appl. No.: 781,661

[22] Filed: Apr. 11, 1985

[30] Foreign Application Priority Data

Apr. 16, 1984 [GB] United Kingdom ............... 8409788

[51] Int. Cl.4 .................. H01L 25/00; G01J 1/00; H01J 40/14
[52] U.S. Cl. .................. 250/332; 250/338.3; 250/578; 358/113; 358/212
[58] Field of Search .......... 358/105, 213, 95, 221, 358/113, 212, 213.14, 213.16, 213.18, 213.26, 213.27, 213.28; 250/578, 332, 233, 338, 338.1, 338.3

[56] References Cited

U.S. PATENT DOCUMENTS

| | | | |
|---|---|---|---|
| 4,072,863 | 2/1978 | Roundy | 358/113 X |
| 4,091,414 | 5/1978 | Chow | 358/113 |
| 4,162,402 | 7/1979 | Hopper | 250/351 X |
| 4,301,471 | 11/1981 | Holscher et al. | 358/105 |
| 4,363,963 | 12/1982 | Ando | 358/212 X |
| 4,388,646 | 6/1983 | Strother | 358/160 |
| 4,399,466 | 8/1983 | Stephenson | 358/221 X |
| 4,524,385 | 6/1985 | Billingsley et al. | 358/113 |
| 4,525,743 | 6/1985 | Wood, Jr. et al. | 358/213 |
| 4,581,651 | 4/1986 | Miyata et al. | 358/213 |

Primary Examiner—Stephen C. Buczinski
Assistant Examiner—Linda J. Wallace
Attorney, Agent, or Firm—William R. Hinds

[57] ABSTRACT

A thermal detector comprises a row of thermal detector elements each connected to a common bus line via the gate of a high impedance input preamplifier and a switch. The line output from the bus line is taken across a load resistance providing a common source follower load for the prepamplifiers. The signal across the load is passed through an anti-aliasing low-pass filter to a sample-and-hold. Signals then pass to a high-pass digital filter arranged to substract successive signals from each detector element corresponding to open and closed positions of a radiation modulator. This attenuates 1/f noise. The filters are located outside the row. Bulky filter components may accordingly be employed giving good noise performance without affecting detector element spacing. The preamplifiers and the switches are preferably MOSFETs. The detector may incorporate many rows of detector elements to provide a two-dimensional array.

10 Claims, 7 Drawing Sheets

Fig.3.

THERMAL DETECTOR

TECHNICAL FIELD

This invention concerns a thermal detector of the kind including an array of thermal detector elements. The invention is applicable to both linear and two-dimensional array detectors.

Linear detector arrays are particularly suitable for applications where there is relative motion between the detector head and any objects being imaged. Examples include Intruder Alarm Detectors where the object moves across the detector head, and Pushbroom Linescan Detectors where a moving vehicle scans or pans the detector head in a continuous motion across the scene. Arrays of many hundreds of detector elements may be required, but because of the absence of detector scanning along the line, bandwidths are low. In many of these applications a bandwidth of less than 50 Hz can be attained. Thus in the example of an Intruder Alarm Detector, where object velocities $U_o$ are usually in the range 2 m/sec, a scene resolution Q of 0.1 m leads to a bandwidth $U_o/2Q$ that is less than 50 Hz.

Two dimensional detector arrays are useful for a wide range of infra-red surveillance applications.

Thermal detector development is currently directed towards the achievement of arrays having large numbers of elements with small inter-element pitch.

BACKGROUND ART

Linear and two-dimensional detector arrays have been based hitherto on the read-out of an array of pyroelectric elements by a charge-coupled device (CCD). These CCD-hybrid detectors are discussed in a recent article by R Watton et al entitled "Performance and Technologies for Linear and Two-Dimensional Pyroelectric Arrays", IEE Conference Publications No. 228, 2nd International Conference on Advanced Infrared Detectors and Systems, pp 49–53 (1983). However in this CCD-hybrid arrangement, both the signal and noise on each element are sampled and held at the pixel by the use of the CCD input well. This results in aliasing of the noise at the pixel. In particular the thermal noise in the CCD gate, when aliased, gives rise to a noise of $(4/3 kT\alpha/C)^{\frac{1}{2}}$ volts R.M.S, where C is the detector capacitance and $\alpha$ the injection efficiency. Since the pyroelectric voltage signal developed is independent of the element area, A, the signal to noise ratio for this dominant noise source is proportional to $A^{\frac{1}{2}}$, ie it is proportional to the element pitch.

The current trend, in the development of large arrays, is to reduce element pitch but, from the above result, this occurs in the CCD design at the expense of performance. CCD readout is effectively limited to an inter-element pitch of 100 $\mu$m or greater to achieve an acceptable signal to noise ratio with conventional technology.

Other useful contemporary references relating to CCD-pyroelectric hybrids are given as follows:
R. Watton, et al, Infrad Physics 22 pp 259–275 (1982);
R. Watton, et al; SPIE Proceedings Vol 395 (1983); and,
D. Buss, et al, IEEE Trans EL Devices, Vol ED-27, 998–1000 (1980).

As an alternative to the CCD approach, detector elements have been read-out by means of multiplexed matrix switches and bus lines. Examples of this alternative approach are described by G S Hopper, U.S. Pat. No. 4,162,402. As described there, a row of ferro-electric detector elements is coupled to a bus line via a row of a like number of metal-oxide semiconductor field-effect transistor (MOSFET) switches. The bus line signal is relayed to a video processor via a common amplifier.

A detector similar to that considered here is described by A. Carlson et al in an article entitled "Solid-state pyroelectric imaging system", SPIE vol 267 Staring Infrared Focal Plane Technology pp 86–98 (1981). It includes a row of pyroelectric thermal detector elements, a semiconductor support layer, a respective high impedance input preamplifier with associated switch embodied in the layer and provided for each element, together with a common bus line. The row of pyroelectric elements is coupled to a bus line via the switchable preamplifiers, each of which comprises a double-gate junction field-effect transistor (JFET). Each detector element is connected to one gate of its corresponding JFET and the signal voltage on this gate controls the flow of current through the transistor channel. This preamplifier is switched by means of a voltage address applied to its other gate. A problem, associated with this choice of preamplifier, is the relatively significant magnitude of gate leakage current. This places a severe restriction on the transistor construction and operation. The silicon array of JFET's must be produced using special processing techniques in order to keep the leakage current below about $10^{-13}$A. The bus line is followed by an impedance converter and an analog shift register.

DISCLOSURE OF THE INVENTION

The invention disclosed herein is directed to thermal detectors that include large numbers of sensing elements, and it is intended to allow implementation where the inter-element pitch is relatively small (ie < 100 $\mu$m).

The present invention provides a thermal detector including:

(1) a row of thermal detector elements disposed to receive radiation from a scene, (2) a row output line arranged to relay detector element signals to a common row output, (3) a respective power amplifier associated with each detector element, each power amplifier being arranged to amplify detector element signals for output to the row output line and to decouple detector element capacitance from that of the row output line, (4) modulating means arranged to modulate radiation from the scene such that each detector element experiences alternate light and dark time intervals and becomes illuminated in sequence along the row, (5) addressing means synchronised with the modulating means and arranged to address the power amplifiers sequentially and sample their signals to the common row output to provide alternate light and dark sets of signals, and (6) a band pass filter arranged to receive light and dark sets of signals from the common row output, the filter having transmission characteristics to pass detector element output signals and including both an anti-aliasing low pass filter and a high pass filter arranged to extract respective difference signals from each detector element's light and dark output signals.

The invention overcomes a combination of problems arising in sampled thermal detector arrays. It has been found that such arrays are unacceptably noisy for many purposes. Surprisingly, it has been discovered that one major source of noise arises from aliasing of high frequency noise into the base band produced by sampling individual detector element signals. This as previously discussed was thought to be a problem confined to pyroelectric element arrays with CCD read-out. Furthermore, it has been found necessary to provide for attentuation of 1/f noise (f=frequency). However, it is a practical impossibility to locate comparatively bulky filter components adjacent individual detector elements around 50μ square for example. The invention solves these problems by providing for the detector element signals to be multiplexed to a common row output and thence to a band-pass filter. The filter may then be located outside the array and does not require to be associated with any individual detector element. Embodiments of the invention exhibit a noise advantage of a factor of ten or more as compared to prior art CCD read-out thermal detectors of similar geometry. The invention therefore gives substantial improvements, particularly for arrays having an inter-element pitch less than 100 μm.

In a preferred embodiment the high pass characteristics of the band pass filter are implemented with the aid of delaying means arranged to delay signals sufficiently to synchronize them with respective succeeding signals to be involved in subtraction. Signals may be low-pass filtered by an RC filter and then digitised before delay and subtraction in digital devices forming the high-pass filter. The low-pass filter may include an amplifier and a sample and hold device.

The thermal detector elements may be of the high impedance pyroelectric variety, and each may be associated with a respective switchable high input impedance preamplifier such as a MOSFET source follower device. The preamplifiers may be incorporated in a silicon layer supporting the detector elements. They may also incorporate addressable MOSFET switches in their source connections, and share a common source resistor arranged at the common row output. The switchable preamplifiers may alternatively be double-gate JFET devices, but MOSFETs are preferred because of their lower leakage current and correspondingly lower noise.

The row of detector elements may be accompanied by one or more equivalent additional rows arranged to form a two dimensional array having detector elements arranged in rows and columns. The detector elements in each column may be read out synchronously by addressing means common to all rows, and the signals therefore may be multiplexed on to a single line via a shift register and after low-pass filtering. High-pass filtering may then be performed by a single filter for the whole array, this filter being arranged to receive signals from the shift register.

The thermal detectors may be of pyroelectric material such as lead zirconate (PZT), deuterated triglycine sulphate (TGS) or strontium barium niobate (SBN) ceramic. Alternatively, thermally responsive dielectric material may be used, such as for ferroelectric substance.

BRIEF INTRODUCTION OF THE DRAWINGS

In the drawings accompanying this specification:
FIG. 1 is a schematic block diagram of a pyroelectric hybrid linear array detector with associated preamplifiers and a common low-pass filter;
FIG. 2 is a schematic block diagram, detailed in part only, of a two-dimensional pyroelectric hybrid array comprised of rows components shown in the preceding figure;
FIG. 3 is a schematic block diagram of a high pass digital subtractive filter for use with the detectors shown in FIGS. 1 and 2 above;
FIG. 4 is a timing graph illustrating the variation of radiation intensity incident upon the array, and the variation of the array element temperature resulting;
FIG. 5 is an illustrative cross-section of a detector element, this serving as a simple thermal model for the analysis outlined hereinbelow;
FIG. 6 is a noise equivalent circuit for the detector shown in FIG. 2 above;
FIGS. 7 to 10 are graphs showing the dependance of noise-equivalent temperature detectivity (NETD) calculated as a function of detector element thickness for three values of thermal conductance, for an array of 300 elements and two values of voltage noise, and for an array of 100 elements and the same two values of voltage noise, respectively;
FIG. 11 is a graph depicting the variation of RMS noise and signal with element thickness; and
FIG. 12 is a graph depicting calculated values of the noise-equivalent temperature detectivity (NETD) for a known CCD-hybrid detector, as a function of chopper frequency, and plotted for three different pyroelectric materials.

DESCRIPTION OF PREFERRED EMBODIMENTS

Embodiments of the invention, together with an analysis of their performance, will now be described, by way of example only, with reference to the accompanying drawings.

Figure 1:
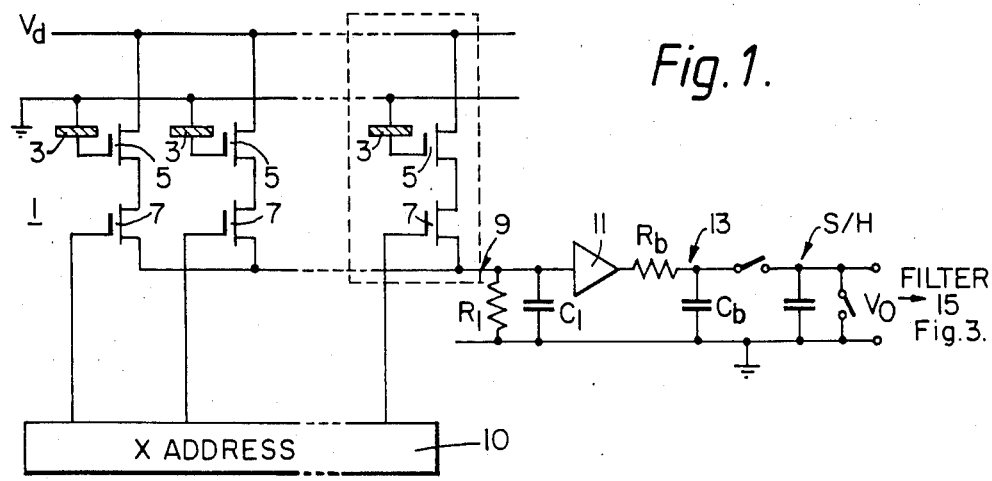
Figure 2:
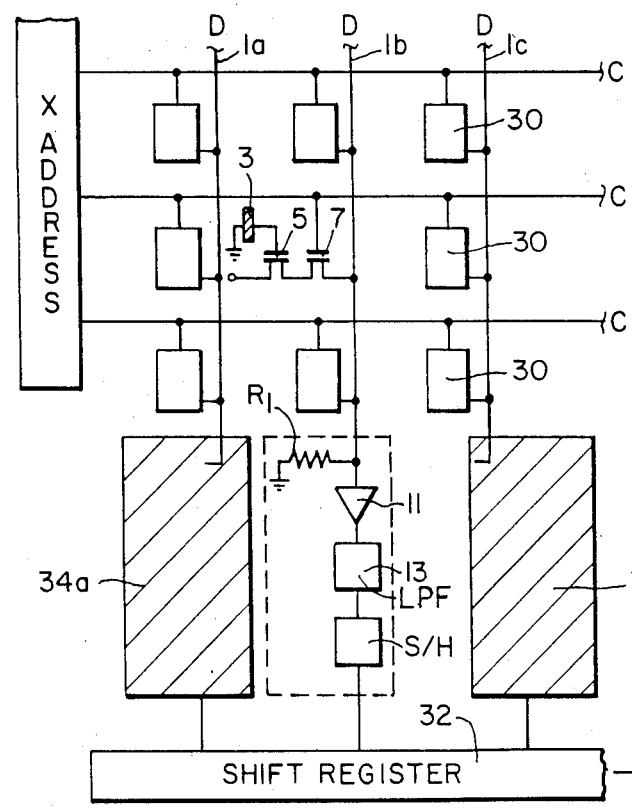

Referring to FIG. 1, there is shown a linear or row pyroelectric array 1 utilising switched MOSFET read-out and an anti-aliasing filter. Individual pyroelectric detector elements 3 are shown shaded. The linear array 1 may be one row or a two dimensional array as indicated in FIG. 2 (to be described in more detail later). Each pixel of the array 1 contains a pyroelectric detector element 3, a MOSFET preamplifier 5 and a MOSFET switch 7, and is coupled to a common bus line 9. A resistance load $R_1$ is located at the output of the bus line. The resistance $R_1$ acts as source follower load to each individual preamplifier 5 when connected in turn to the bus line 9. The switches 7 are activated by an X address device 10. Each preamplifier 5 serves to decouple the detector capacitance ($\sim 1_{pf}$) from the much larger stray capacitance $C_1$ of the line ($C_1 \sim 10-50_{pf}$). The line signal developed across the source follower load $R_1$ is fed to the input of an amplifier 11, and thence to an anti-aliasing low pass filter 13 and a sample-and-hold S/H. In this design, the most significant noise sources are those at the detector 3 and the preamplifier input, and voltage noise on the line amplifier 11.

The pyroelectric array 1 is arranged to receive the thermal image of a remote scene produced by a conventional imaging system (not shown) of the kind well known in the art. The imaging system incorporates a focal plane chopper or radiation modulator arranged conventionally. The chopper produces alternate equal light and dark time periods at each detector element 3, with each element becoming illuminated in sequence. These time periods are arranged to be equal to $\tau_l$ the line time, ie the time for a light/dark chopper edge to traverse the whole array or row 1. The operation of the X address device 10 is synchronised to the chopper rotation.

At the output of the line 9, the noise bandwidth is limited by the filter 13—shown simply by resistance and capacitance components $R_b$ and $C_b$. The filter 13 output voltage is sampled and held. There are N detectors in the linear array 1, and the MOSFET switch 7 at each pixel is closed for a time $\tau = \tau_l/N$. Switching occurs in sequence along the array 1, so that the line voltage consists of a series of pulses of duration $\tau$ as successive elements 3 are addressed. This leads to two design criteria involving the line output circuitry. These are:

$$R_1C_1/(1+g_mR_1) < \tau/2\pi \quad (1)$$

$$R_bC_b < \tau \quad (2)$$

where $1/g_m$ is the output impedance of each preamplifier 3.

In practice, if $\tau_l = 2 \times 10^{-2}$ secs and N=100 then, for $C_1 = 30 pf$, it follows that $R_1 < 10^6$ ohms. In the filter 13, the time constant $\tau_b(\tau_b = R_bC_b)$ should be less than $\tau/3$. At this value, since $(1-e^{-\tau/\tau_b})$ is 0.95, then 5% of the signal from the rth pixel is lost into the (r−1) th pixel. This results in a modulation transfer function (MTF) reduction to 90% at the highest spatial frequencies. In practical terms, to keep the filter components to a reasonable size, a filter time constant $\tau_b \approx \tau/10$ is assumed as a more suitable value in the analysis that follows hereinbelow. This produces a small but not serious signal loss between adjacent pixels.

Figure 3:
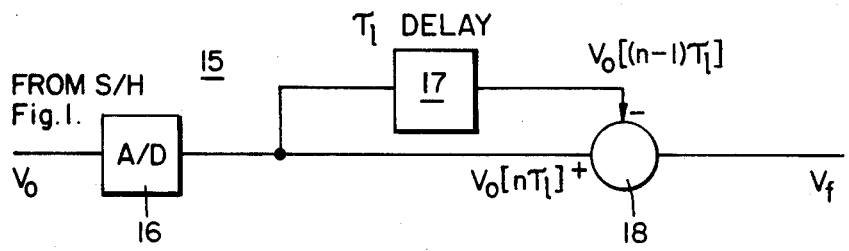

The question arises as to the lower limit of the noise bandwidth. This is particularly important for pyroelectrics hybrid design, since the shot noise on any leakage current at the detector input appears across the detector capacitance and gives rise to a 1/f contribution to the voltage noise. FIG. 3 shows a digital filter 15 providing high-pass filtering to attenuate low frequency noise. The filter 15 comprises an analogue to digital (A/D) converter 16 connected both directly and via a line store 17 to a subtractor 18. The store 17 provides a delay of $\tau_l$, so that successive light and dark signal samples from each detector element 3 are subtracted. For the noise terms, the line output samples will have a noise contribution $V_o$(noise) which is the result of sampling the noise voltage applied to the sampling switch S/H. For each detector element 3, the spectral component $V_f$(noise) of this noise at frequency f after subtraction of successive signal samples at 18 is given by:

$$V_f(\text{noise}) = V_o(\text{noise})\{e^{j\omega n\tau_l} - e^{j\omega(n-1)\tau_l}\}$$

i.e. $V_f(\text{noise}) = 2 \sin(\omega\tau_l/2)V_o e^{j\omega(n-\frac{1}{2})\tau_l}$ (3)

The parameter n indicates the nth signal sample from a detector element and $\omega = 2\pi f$. The low frequency noise terms are effectively reduced by a filter factor given by $2 \sin(\omega\tau_l/2)$. As has been mentioned, the chopper (not shown) has light and dark or open and closed periods equal to $\tau_l$ the line time. The signals sampled at the end of each open and closed period are then equal in magnitude but of opposite sign. The subtraction performed by the digital filter 15 accordingly results in twice the contribution $V_o$(signal) to overal output signal $V_o$ and the removal of offsets associated with each element 3. The combination of high-pass filter 15 and low-pass filter 13 provides a band-pass filter arranged to pass the output pulse frequency generated by the switched MOSFETs 5. Expressions for the chopped signal, and the dominant noise terms at the line output, will now be derived. The digital filter 15 is applied to these, and after integration of the noise, over all frequencies, the noise-equivalent temperature detectivity (NETD) will be calculated.

THE SIGNAL

Figure 4:
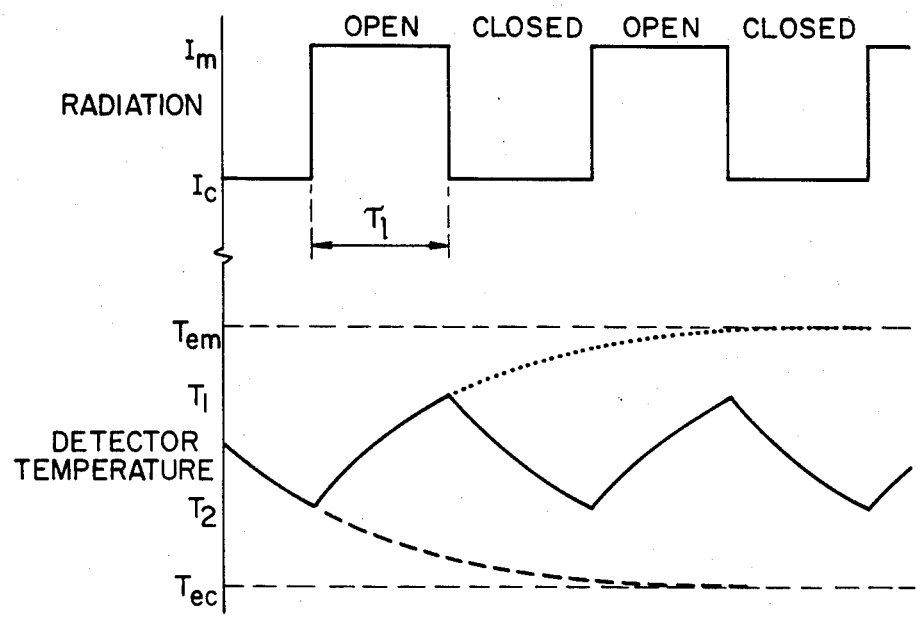

The chopped radiation from a thermal scene and the resulting temperature fluctuation in each pyroelectric element 3 are shown in FIG. 4. All temperatures are referenced to the ambient temperature $T_a$ at the detector camera head. The level $I_m$ is then the radiation from the mean scene temperature, $T_m$ above $T_a$, and may be written as:

$$I_m = \frac{1}{4F^2} \int_8^{14} \left(\frac{dW_\lambda}{dT}\right)_{300°K} T_m d\lambda = \frac{5 \times 10^{-5}}{F^2} T_m \text{ watts/cm}^2; \quad [4]$$

where $W_\tau$ watts/cm$^2$ micron is the spectral radiant emittance for the scene and F is the F-number of the optics used to focus radiation. onto the target plane. During the closed phase of the chopper, the radiation $I_c$ on each element 3 is a function of the chopper temperature. If the chopper is stopped with the detector element 3 exposed to the scene, the equilibrium temperature in each element 3 is $T_{em}$, and, similarly with the chopper closed the equilibrium temperature will be $T_{ec}$. Then:

$$T_{em} - T_{ec} = (I_m - I_c)/g; \quad (5)$$

where g is the thermal conductance from each element 3 per unit area. With the chopper rotating, such that the open and closed periods are $\tau_l$, the line time, the temperature fluctuation as shown in FIG. 4 is, $$T_1 - T_2 = \frac{(I_m - I_c)}{g} \tanh(\tau_l/2\tau_t); \quad [6]$$

where $\tau_t$ is the thermal time constant of each detector element 3.

Each element 3 is sampled at the end of each open and closed field and the pyroelectric charge associated with the temperature change is given as $pA(T_1 - T_2)$ where p is the pyroelectric coefficient and A is the element area. The voltage signal at each element, referenced to the mean level between open and closed fields, is then given by:

$$V_m = \pm \frac{pA(I_m - I_c)}{2g(C + C_a)} \tanh(\tau_l/2\tau_t); \quad [7]$$

when the positive and negative signs refer to the open and closed fields respectively, C is the electrical capacitance of the detector element 3, and $C_a$ is the electrical input capacitance of the preamplifier MOSFET 5. The detector element signal difference $\Delta V$ corresponding to two regions of the scene with 1° C. temperature difference, ie temperatures $T_m$ and $T_m + 1$ respectively, is given by:

$$\Delta V = V_m(T_m + 1) - V_m(T_m) = \pm \quad [8]$$

$$\frac{5 \times 10^{-5} pA \tanh(\tau_l/2\tau_t)}{2gF^2(C + C_a)} \text{ [Volts/°C.]}$$

Figure 5:
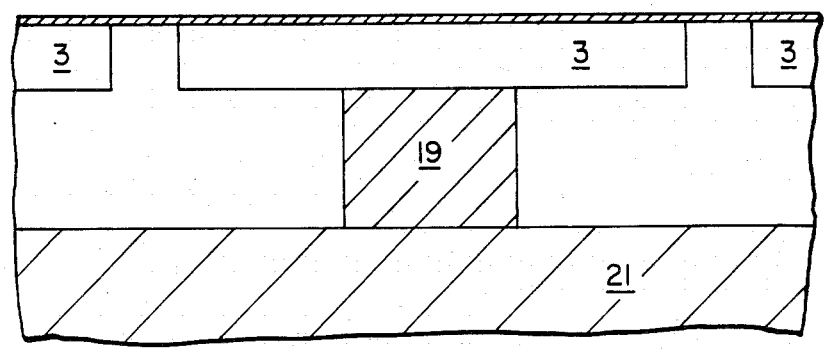
Figure 7:
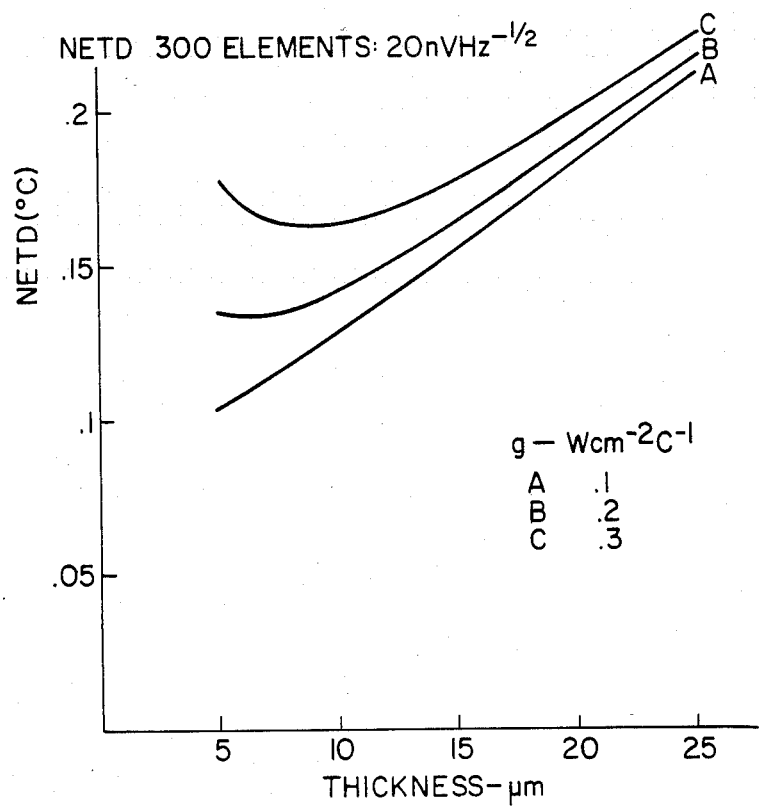

In the above expression it has been assumed that the thermal behaviour of each detector element 3 can be modelled by a simple thermal time constant, $\tau_t = c_t/g$, where $c_t$ is the thermal capacitance per unit area. This is in general not the case. As shown in FIG. 5 the design for mounting the pyroelectric elements 3 may involve a multilayer sandwich of materials—for example an isolation mesa 19 and a silicon substrate 21. The analysis must accordingly be modified to suit any specific mounting arrangements.

For the simple structure shown in FIG. 5, the value of the thermal conductance g is largely determined by the thermal isolation mesa 19, that is:

$$g = k_i A_i / d_i A; \tag{9}$$

where $k_i$, $d_i$ and $A_i$ are the thermal conductivity, thickness, and, area of the mesa 19. For a typical photoresist mesa with $k_i$ of 1.5 $10^{-3}$ W cm$^{-1}$°C.$^{-1}$ and $A_i/A$ equal to 0.1, g=0.15 W cm$^{-2}$°C.$^{-1}$ for a thickness of 10 μm.

The thermal capacitance $c_t$, as a first approximation, may be modelled as the sum of that of the pyroelectric layer 3 and the mesa 19, that is:

$$c_t = c_p d_p + c_i d_i A_i / A = c_p (d_p + c_i d_i A_i / c_p A); \tag{10}$$

where $c_p$ is the volume specific heat of the pyroelectric 3 and $c_i$ that of the isolating material 19. The thermal loading can thus be expressed as an extra thickness of pyroelectric material which is in the region of 1 μm ($c_i/c_p \sim 0.5$).

The voltage signal from each detector element (see equation (8)) is switched onto the bus line 9 for the time $\tau_l/N$. It is amplified by the preamplifier source follower 5 with a gain $\alpha_o = R_1 g_m / (1 + R_1 g_m)$ and by the line amplifier 11 with a gain of $\alpha$. The signal voltage $V_o$(signal) transferred to the sample-and-hold capacitor S/H, referred to the mean level between the open and closed fields, is then:

$$V_o(\text{signal}) = \pm \alpha_o \alpha \frac{5 \times 10^{-5} pA \tanh(\tau_l/2\tau_t)(1 - e^{-\tau/\tau_b})}{2gF^2(C + C_a)} \tag{11}$$

where $\tau_b = R_b C_b$

Finally when this voltage is applied to the digital filter 15, and after subtraction of dark from light signals, the resulting signal component at frequency f is:

$$V_f(\text{signal}) = 2 V_o(\text{signal}) \tag{12}$$

It is this voltage $V_f$(signal) that will be used, in conjunction with calculated filtered noise, to derive the NETD.

THE NOISE SOURCES AND MAGNITUDES

Figure 6:
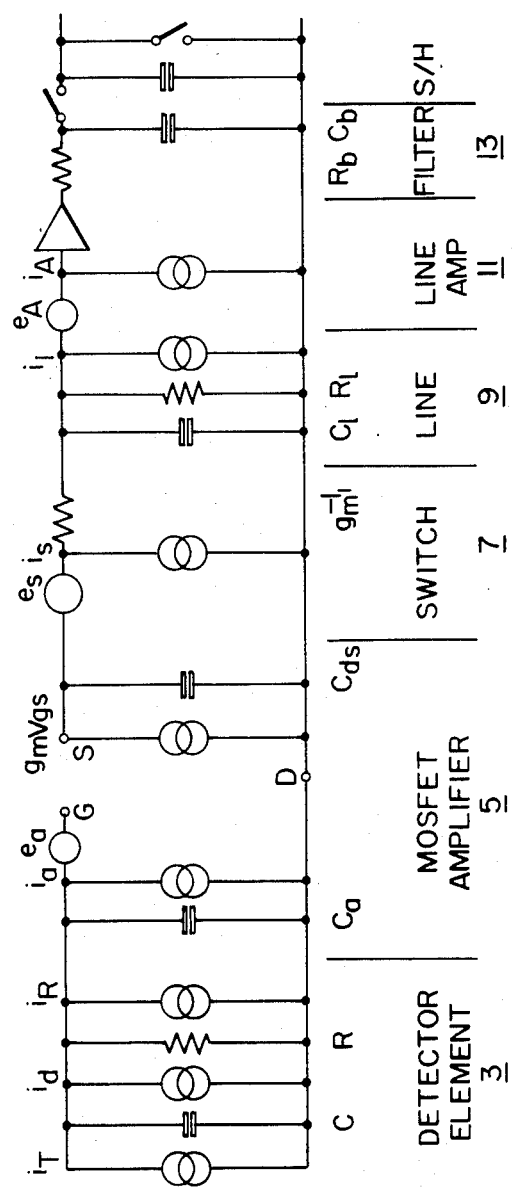
Figure 9:
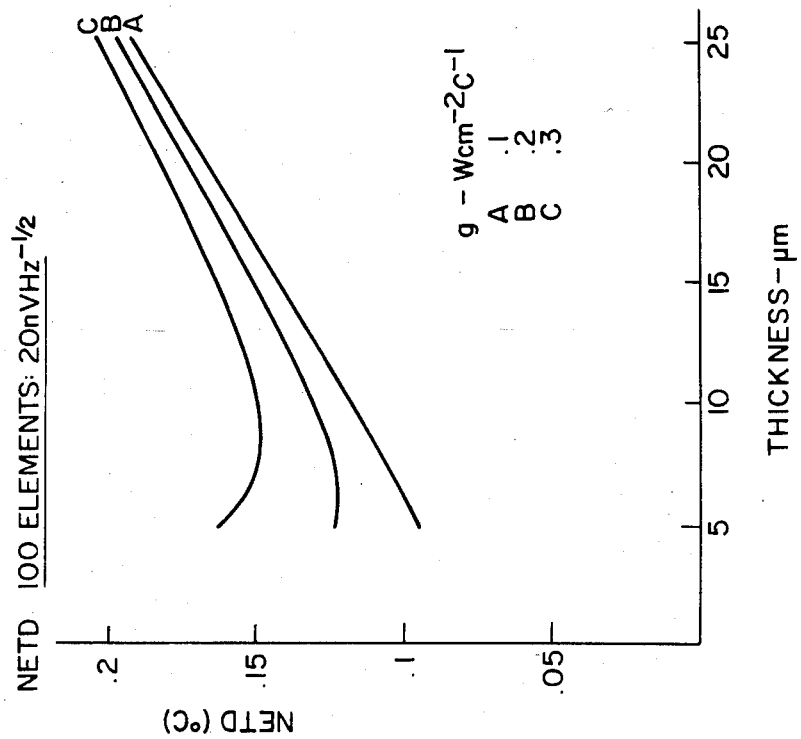
Figure 8:
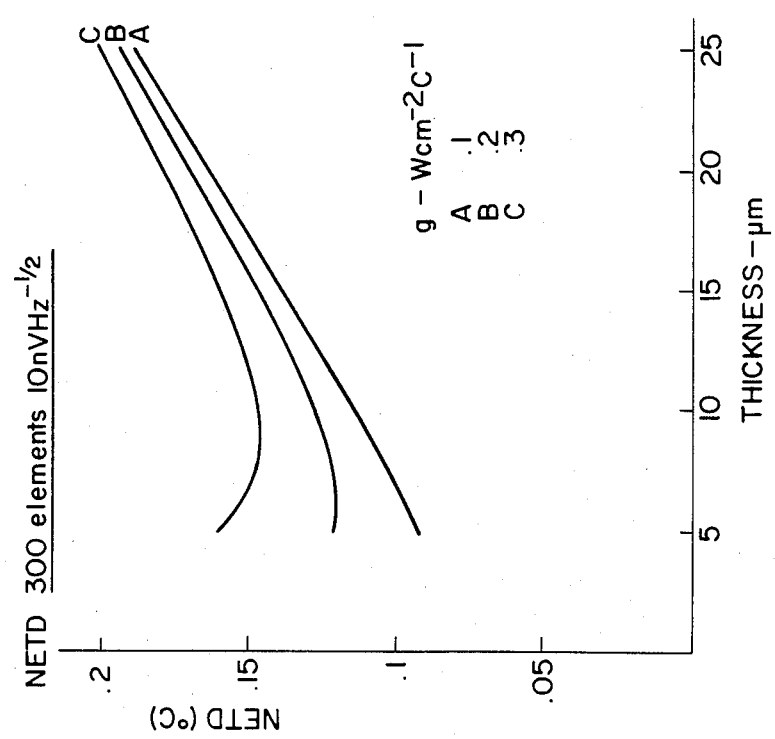

The noise sources are shown in the equivalent circuit of FIG. 6. The sources at the detector 3 and preamplifier input 5 are listed in Table I below using standard rms noise expressions. (See for for reference: Porter, S G, 1981, Ferroelectrics, 33, 193-206).

TABLE I

Temperature fluctuation noise, $i_T = (4kT^2 gA)^{\frac{1}{2}} p\omega/g(1 + \omega^2 \tau_t^2)^{\frac{1}{2}}$;
Dielectric loss noise:- $i_d = (4kT\omega c \tan \delta)^{\frac{1}{2}}$;

TABLE I-continued

DC resistance noise (Johnson noise):- $i_R = (4kT/R)^{\frac{1}{2}}$;
Preamp voltage noise:- $e_a = (\nu_a^2 + z^2/f)^{\frac{1}{2}}$;
Preamp current noise:- $i_a = (2ei_1)^{\frac{1}{2}}$.

In the above Table, tan δ denotes the dielectric loss of the pyroelectric material, z is the magnitude of the 1/f noise of the MOSFET preamplifier at 1 Hz, f is the frequency and T is the ambient temperature measured at the detector head.

In the circuitry after the preamplifier 5 there are voltage and current noise sources associated with the switch 7: $e_s$ and $i_s$, and with the line amplifier 11: $e_\alpha$ and $i_\alpha$ and a noise current source $i_n$ associated with the source resistor $R_1$.

For the noise sources at the detector and preamplifier input, take as an example the preamplifier voltage noise $e_a$, and the noise component $V_o$(noise) at angular frequency ω. The sampled level $V_o$(noise) is given by:

$$V_o(\text{noise}) = \frac{\alpha_o \alpha e_a e^{j\omega n \tau l}}{1 + j\omega \tau_b}; \tag{13}$$

where $\alpha_o$ is the source follower gain which is close to unity, $\alpha$ is the line amplifier gain, $\tau_b = T_b C_b$ and $j = \sqrt{-1}$. Corresponding expressions for noise voltage $V_o$(noise) derived from the current noise sources at the input, which are listed in Table I above, can be obtained by substituting i(noise)/jω(C+$C_a$) for $e_a$ in equation (13).

The noise sources which appear after the preamplifier 5, namely: e, $i_n$ and $i_\alpha$, are shunted by the low output impedance 1/$g_m$. These are therefore negligible. On the other hand, the amplifier 11 voltage noise gives rise to an output given by equation (13) but with $e_a$ replaced by $e_a/\alpha_o$. Since $\alpha_o$ is close to unity, this source of noise can be significant and must be added in quadrature with the preamplifier voltage noise $e_a$.

From equation (13), with the various noise sources as replacements for $e_a$, the noise at the digital filter output can be obtained from equation (3), that is equation (13) is multiplied by the factor 2 sin (ωτ$_l$/2). Dropping the gain factor $\alpha \alpha_o$ by comparison with the signal:

$$V_f^2(\text{noise}, e_a) = \frac{e_a^2 4 \sin^2(\omega \tau_l / 2)}{(1 + \omega^2 \tau_b^2)}; \tag{14}$$

and the total noise is:

$$\int_0^\infty V_f^2(\text{noise}, e_t) df; \tag{15}$$

where $$e_t^2 = e_a^2 + e_\alpha^2/\alpha_o^2 + (i_T^2 + i_d^2 + i_R^2 + i_a^2)/\omega^2(C + C_a)^2 \tag{16}$$

The results of integration are listed in the table appearing below:

TABLE II

Noise Integrals: $\int_0^\infty V_f^2 df$

Voltage noise (Dominant term): $V_a^2 / 2\tau_b'$

TABLE II-continued

| | |
|---|---|
| I/f noise: | $2z^2 J$ |
| Dielectric loss noise: | $(4 T C \tan\delta) J/\pi (C + C_a)^2$ |
| Current noise: | $e i_L (\tau_l - \tau_b)/C + C_a)^2$ |
| Johnson noise: | $2kT(\tau_l - \tau_b)/R(C + C_a)^2$ |
| Temperature noise: | $\dfrac{2kT^2 p^2 A [\tau_t(1 - e^{-\tau_l/\tau_t}) - \tau_b(1 - e^{-\tau_l/\tau_b})]}{g(C + C_a)^2 (\tau_t^2 - \tau_b^2)}$ |

In Table II, the symbol J denotes the following integral:

$$J = a^2 \int_0^\infty \frac{(1 - \cos z) dz}{z(z^2 + a^2)} \; ; \text{ where } a = \tau_l/\tau_b = N\tau/\tau_b$$

If $\tau_b = \tau/10$, as suggested, then $a = 10N$ where N is the number of elements 3 in the line 1. The integral J is tabulated below for a range of values of a.

TABLE III

| a | 30 | 100 | 300 | 1000 | 3000 | 10,000 |
|---|---|---|---|---|---|---|
| J | 4.23 | 5.3 | 6.25 | 7.61 | 8.64 | 9.73 |

Using the values of the integrated mean square noise voltages, the NETD is calculated as follows:

$$NETD = \left[ \int_0^\infty V_l^2(\text{noise}, e_l) \right]^{\frac{1}{2}} \left[ \frac{5 \times 10^{-5} pA \tanh(\tau_l/2\tau_l)(1 - e^{-\tau/\tau_b})}{gF^2(C + C_a)} \right] \quad [18]$$

PARAMETER VALUES AND RESULTS OF ANALYSIS

The following typical parameter values have been used to evaluate the above signal and noise expressions:

| Pyroelectric - lead zirconate ceramic. | |
|---|---|
| $p = 3.5 \times 10^{-8}$ C cm$^{-2}$ °C$^{-1}$ | $\epsilon = 300$ |
| $c_p = 2.8$ J·cm$^{-3}$ | $\rho = 6 \times 10^{10}$ ohm·cm |
| $\tan\delta = 5 \times 10^{-3}$ | |
| MOSFET | |
| $v_a = 2 \times 10^{-8}$ V Hz$^{-\frac{1}{2}}$ | $z = 1.1 \times 10^{-6}$ V |
| $i_L = 10^{-14}$ A | $C_a = 1.0$ pf |

The calculations given have been carried out for an element of typical area 50 μm square. Thermal conductance values in the range $g = 0.1$ to $0.3$ W cm$^{-2}$K$^{-1}$ have been used and the NETDs normalised to an F/1 aperture.

Figure 11:
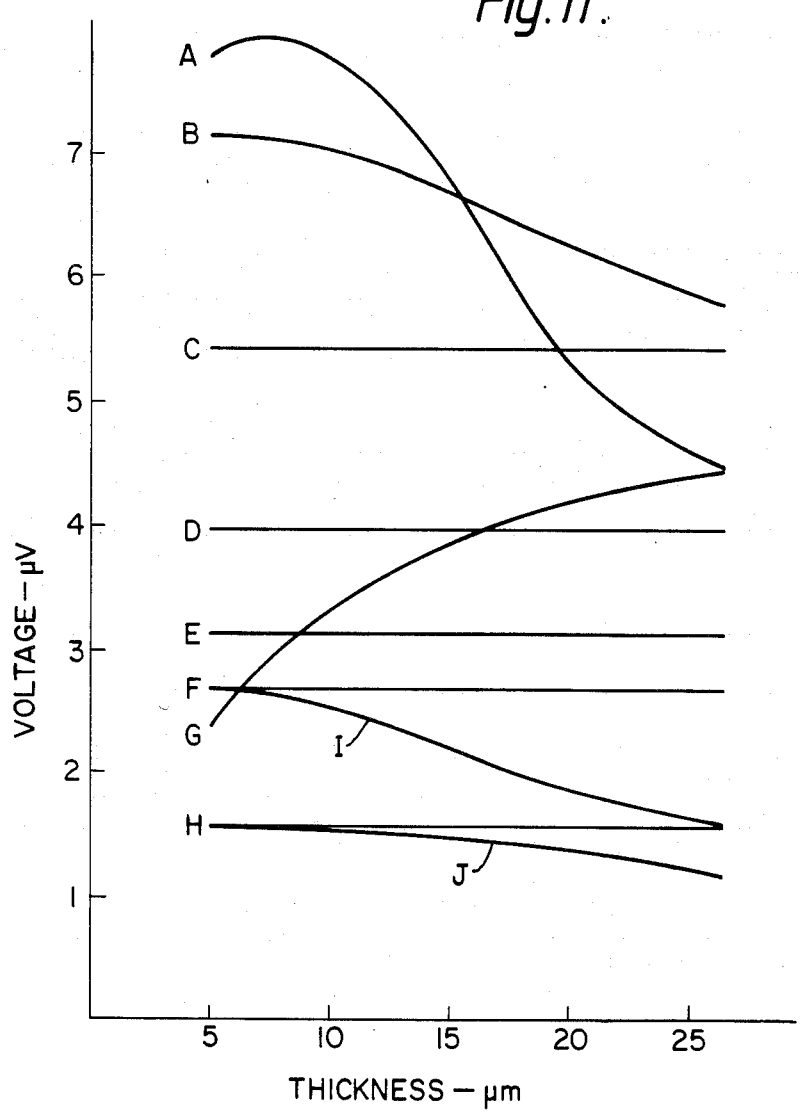

Results are given in terms of the NETD of the detector 1 for an F/1 aperture, (see the graphs shown in FIGS. 7 to 10) for arrays 1 of 100 and 300 detector elements 3 with voltage noises for the MOS amplifiers 5 to 10 and 20 nVHz$^{-\frac{1}{2}}$ respectively. These noise values may be achieved at drain currents of approximately 50 and 10 μA respectively. The graph shown in FIG. 11 shows the individual sources of noise (RMS) and the signal level for 0.1° C. temperature difference in the scene. In this graph the symbols A to J denote the following:

A: Signal for 0.1° C. (g=0.2 W cm$^{-2}$°C.$^{-1}$)
B: Dielectric noise
C: Voltage noise (300 elements: 20 nV Hz$^{-\frac{1}{2}}$)
D: I/f noise
E: Voltage noise (100 elements: 20 nV Hz$^{-\frac{1}{2}}$)
F: Voltage noise (300 elements 10 nV Hz$^{-\frac{1}{2}}$)
G: Shot noise
H: Voltage noise (100 elements: 10 nV Hz$^{-\frac{1}{2}}$)
I: Temperature noise
J: Johnson noise The foregoing calculations demonstrate that it is possible to manufacture large arrays of pyroelectric detector elements 3 in linear or in 2-dimensional format, having an NETD at F/1 in the region of 0.1–0.2° C. (depending on the thermal isolation and reticulation structures employed in construction). A prior art array with CCD read-out with similar geometry to that discussed would have an NETD a factor of ten or more worse. For the pyroelectric structures, the performance is largely dominated by dielectric loss noise, and the above results indicate the importance of keeping the MOS amplifier 5 voltage noise low, especially in very large arrays 1.

The readout scheme disclosed above uses standard MOS technology with only a small number of active elements at pixel level. A small detector pitch can be achieved without the need to resort to the emerging low dimension (ie submicron) technologies.

Figure 12:
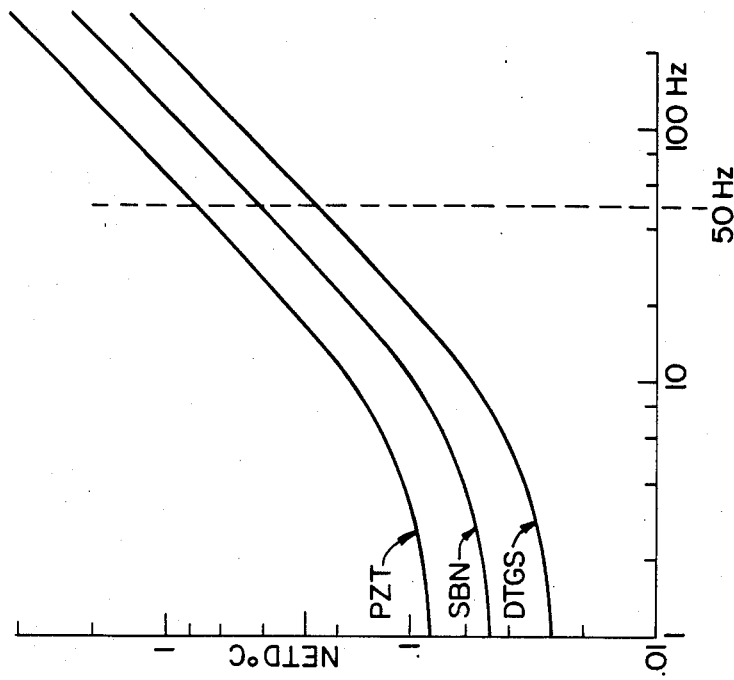
Figure 10:
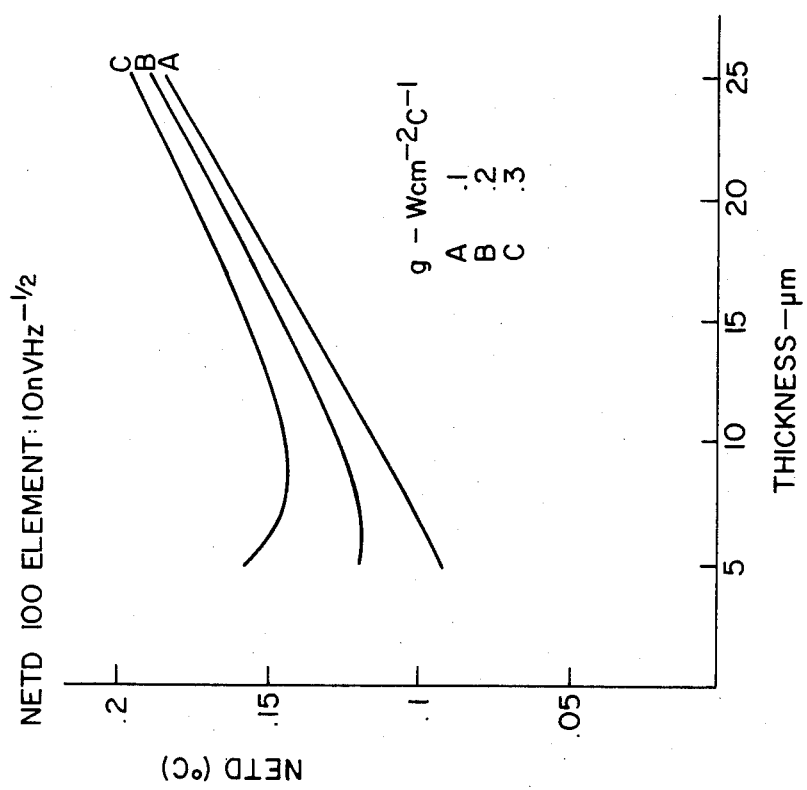

For the purpose of comparison, the NETD vs. chopper frequency characteristics of state of art charge coupled device (CCD) hybrid pyroelectric detectors are shown in FIG. 12. This graph is taken from a recent publication "Performance and Technologies for Linear and Two Dimensional Pyroelectric Arrays", by R Watton, et al, ICC Conference Publn No 228, 2nd Int Conf on Advanced Infrared Detectors and Systems, pp 49–53 (1983). The three characteristics shown are for various pyroelectric material hybrids—CCD hybrids of lead zirconate (PZT), strontium barium niobate (SBN) and deuterated triglycine sulphate (DTGS) materials. For the calculation of the curves shown, the thermal conductance 9 of each detector element is taken as 0.1 W/cm$^2$°C., a value attainable using photoresist-mesa isolation. The detector material is 10 μm thick and the detector element pitch is 100 μm. At a typical chopper field rate of 50 Hz, $\tau_l = 2 \times 10^{-2}$ sec the NETDs calculated lie between 0.3° and 0.5° C. This may be compared with the results given above—where for the same thickness 10 μm of lead zirconate ceramic material (PZT) the NETDs calculated lie in the range 0.1°→0.15° C. This indicates that a very significant performance improvement is attainable in accordance with the invention, ie an improvement between twofold and fivefold.

The foregoing analysis has been largely restricted to a linear array or row of N detector elements. A two-dimensional array of two or more such rows may be constructed as briefly mentioned earlier with reference to FIG. 2. Elements in FIG. 2 equivalent to those shown in FIG. 1 are like referenced and individual rows of elements 3 extend vertically, ie at right angles to the corresponding FIG. 1 direction. Three rows of detector elements 3 are shown, these being referenced 1a, 1b and 1c. There are three detector elements 3 per row, ie N=3. The central row 1b has one detector element 3 with associated MOSFETS 5 and 7 as shown. Other detector elements and corresponding MOSFETs are indicated schematically by blocks such as 30. The central row 1b is connected via illustrated resistior $R_1$, amplifier 11, low-pass filter 13 and S/H to a shift register 32. Rows 1a and 1b are connected to shift register 32 via equivalent circuits indicated by blocks 34a and 34c. Output from shift register 32 (o/p) is fed to a high-pass digital filter as shown in FIG. 3. Accordingly, the FIG. 2 array is characterised by one low-pass filter per row but only requiring one high-pass filter for the whole array. The array is addressed in the x direction (along each row) by the x address device illustrated.

The embodiment described with reference to FIGS. 2 and 3 operates as follows. The x address device operates the nth MOSFET switch 7 in all rows 1a to 1c in synchronison, where n=1 to N and N=3 in this embodiment. Accordingly, after the nth switching signal, the shift register 32 holds signals from the nth detector element in each of the rows 1a to 1c; ie the contents of the shift register after the nth switching signal is the output of the nth *column* of detector elements 3. The rows are read out synchronously in a total line time $\tau_l$, or $\tau_l/N$ per detector element 3, as described for the FIG. 1 embodiment. The shift register 32 must accordingly be fully read out serially in a time $\tau_l/N$, and holds M detector element signals, where M is the number of rows of detector elements and is equal to 3 in this embodiment. The read-out time per detector element signal is therefore $\tau_l/NM$. This provides a series of NM signals (corresponding to full array read-out) during the line time $\tau_l$, which is now equivalent to a video frame time. Moreover, these signals are serially multiplexed on to a single line or bus as required for the majority of conventional video displays. They are therefore entirely suitable for a raster scan display. The low frequency noise component of noise on these signals is unaffected by shift register storage and readout, so the single high-pass digital filter is entirely adequate to filter the shift register output obtained from the whole array.

Displays are available having individual lines addressed in parallel, ie simultaneously, rather than serially as in a conventional raster scanned cathode ray tube. A light emitting diode display is an example of this. Such a display would not require the multiplexing shift register 32; each display line might receive each row output directly via a respective digital filter.

We claim:
1. A thermal detector including:
   (1) a row of thermal detector elements disposed to receive radiation from a scene,
   (2) a row output line arranged to relay detector element signals to a common row output,
   (3) a respective power amplifier associated with each detector element, each power amplifier being arranged to amplify detector element signals for output to the row output line and to decouple detector element capacitance from that of the row output line,
   (4) modulating means arranged to modulate radiation from the scene such that each detector element experiences alternate light and dark time intervals and becomes illuminated in sequence along the row,
   (5) addressing means synchronised with the modulating means and arranged to address the power amplifiers sequentially and sample their signals to the common row output to provide alternate light and dark sets of signals, and
   (6) a band pass filter arranged to receive light and dark sets of signals from the common row output, the filter having transmission characteristics to pass detector element output signals and including both an anti-aliasing low pass filter and a high pass filter arranged to extract respective difference signals from each detector element's light and dark output signals.

2. A thermal detector according to claim 1 wherein the low pass filter is disposed adjacent an end of the row of detector elements.

3. A thermal detector according to claim 1 wherein the addressing means includes a respective switch associated with each power amplifier, the switch being arranged to connect the associated power amplifier to or isolate it from the row output line in accordance with whether or not the switch is addressed.

4. A thermal detector according to claim 3 wherein each power amplifier is a field effect transistor source follower and each switch is a transistor connected between the respective source follower and the row output line.

5. A thermal detector according to claim 4 wherein the power amplifiers and transistor switches are embodied in semiconductor material arranged adjacent the detector elements.

6. A thermal detector according to claim 1 wherein the power amplifiers share a common load resistor connected to the common row output.

7. A thermal detector including:
   (1) an array of thermal detector elements arranged in rows and columns,
   (2) a respective output line for each row of detector elements, each line being arranged to relay detector element signals to a respective row output,
   (3) a respective power amplifier associated with each detector element, each amplifier being arranged to amplify detector element signals for output to the respective row output line and to decouple detector element capacitance from that of the respective row output line,
   (4) modulating means arranged to modulate radiation from the scene such that each column of detector elements experiences alternate light and dark time intervals and becomes illuminated in sequence,
   (5) addressing means synchronised with the modulating means and arranged to address the power amplifiers in each row sequentially and to sample their signals to the respective common row output to provide alternate light and dark sets of signals,
   (6) a respective anti-aliasing low-pass filter for each row arranged to attenuate high frequency noise in signals output from the respective common row output, and
   (7) high-pass filtering means arranged to extract respective difference signals from each detector element's light and dark signals after low-pass filtering as appropriate to attenuate 1/f noise.

8. A thermal detector according to claim 7 wherein the addressing means is arranged to read out each column of detector elements synchronously.

9. A thermal detector according to claim 8 wherein the row outputs are multiplexed to a single array output.

10. A thermal detector according to claim 9 wherein the high-pass filtering means is a single high-pass filter arranged to receive signals from the single array output.

* * * * *